United States Patent
Argon et al.

(10) Patent No.: US 8,352,826 B2
(45) Date of Patent: Jan. 8, 2013

(54) SYSTEM FOR PROVIDING RUNNING DIGITAL SUM CONTROL IN A PRECODED BIT STREAM

(75) Inventors: Cenk Argon, Chapel Hill, NC (US); Kinhing Paul Tsang, Plymouth, MN (US)

(73) Assignee: Seagate Technology LLC, Cupertino, CA (US)

( * ) Notice: Subject to any disclaimer, the term of this patent is extended or adjusted under 35 U.S.C. 154(b) by 1137 days.

(21) Appl. No.: 12/186,098

(22) Filed: Aug. 5, 2008

(65) Prior Publication Data

US 2010/0037125 A1   Feb. 11, 2010

(51) Int. Cl.
*H03M 13/00* (2006.01)
(52) U.S. Cl. ........ 714/752; 714/800
(58) Field of Classification Search .......... 714/752, 714/800
See application file for complete search history.

(56) References Cited

U.S. PATENT DOCUMENTS

| | | | |
|---|---|---|---|
| 6,333,704 B1 | 12/2001 | Jung et al. | |
| 6,989,776 B2 * | 1/2006 | Tsang | 341/59 |
| 7,184,486 B1 | 2/2007 | Wu et al. | |
| 7,191,386 B2 | 3/2007 | Kuznetsov | |
| 7,237,171 B2 | 6/2007 | Richardson | |
| 8,024,637 B2 * | 9/2011 | Bliss et al. | 714/755 |
| 8,037,398 B2 * | 10/2011 | Argon et al. | 714/803 |
| 2004/0093554 A1 | 5/2004 | Hung | |
| 2006/0095828 A1 * | 5/2006 | Souvignier et al. | 714/755 |
| 2006/0123328 A1 | 6/2006 | Tonami et al. | |
| 2006/0156167 A1 | 7/2006 | Dielissen et al. | |
| 2006/0156171 A1 | 7/2006 | Kuznetsov et al. | |
| 2006/0220928 A1 * | 10/2006 | Ito et al. | 341/50 |
| 2007/0110188 A1 | 5/2007 | Esumi et al. | |
| 2007/0127728 A1 | 6/2007 | Hong et al. | |
| 2008/0001792 A1 | 1/2008 | Kondo et al. | |
| 2008/0031364 A1 * | 2/2008 | Seo | 375/241 |
| 2008/0086676 A1 * | 4/2008 | Mead | 714/758 |
| 2008/0115036 A1 * | 5/2008 | Kuznetsov et al. | 714/758 |
| 2008/0294840 A1 * | 11/2008 | Bliss et al. | 711/105 |

* cited by examiner

*Primary Examiner* — Yolanda L Wilson
(74) *Attorney, Agent, or Firm* — Deirdre Megley Kvale; Westman, Champlin & Kelly, P.A.

(57) ABSTRACT

A system includes an error correction encoder that encodes data and produces parity bits, and a parity bit processor that disperses the parity bits across the data, placing respective i-bit parity sub-blocks between selected multiple-bit data sub-blocks. The system also modifies one or more of the bits in predetermined positions in respective data sub-blocks based on the bits of the parity sub-blocks that precede them, such that the precoding does not sign invert the data sub-blocks.

20 Claims, 3 Drawing Sheets

SYSTEM FOR PROVIDING RUNNING DIGITAL SUM CONTROL IN A PRECODED BIT STREAM

BACKGROUND

This invention relates generally to encoding using codes that satisfy running-digital-sum constraints.

Before recording or transmission, data are typically encoded for error protection and also for modulation, to preserve signal content against corruption by noise, fading and other interference associated with a communications channel in the recording or transmission system. The modulation encoding is also performed to preserve signal content that might otherwise be filtered out by circuitry in the communications channel. For example, a preamplifier in the circuitry acts essentially as a high pass filter, and filters out much of the low frequency content of the information signal. In certain recording systems, such as, for example, perpendicular recording systems, there is significant energy in the low frequency portion of the information signal. Accordingly, the filtering out of the low frequency content would result in performance degradation. The data are thus encoded to preserve the information in the low frequency content. One example of encoding to preserve the information in the low frequency content is running-digital-sum ("RDS") encoding, which constrains the direct-current ("DC") content of the signal to be transmitted (or recorded). Constraining the DC content of the transmission signal essentially means shifting the low frequency content of the information signal to a higher frequency spectrum so that the information in the low frequency content of the original data signal does not get filtered out at the receiving end.

Typically, the user data are encoded to produce RDS encoded data and the RDS encoded data are further encoded using an error correction code (ECC) to produce error correction code words. The ECC can be a traditional Reed-Solomon (RS) code, an iterative code like a low-density parity-check (LDPC) code, a combination or concatenation of the RS and LDPC codes or, in general, any block or convolutional code or combinations or concatenations thereof.

Before entering the communications channel, the RDS and ECC encoded data and the parity bits are provided to a precoder, which translates them into bit sequences that are optimized for transmission and detection. The precoding, however, essentially disrupts the RDS constraints, and there is thus a trade-off between the optimization for transmission/detection and the encoding to preserve signal content through the channel circuitry.

SUMMARY OF THE INVENTION

A system includes an encoder that encodes data in accordance with an error correction code ("ECC") and produces parity bits, and a parity bit processor that disperses the parity bits across the data, placing a parity sub-block of "i" parity bits between selected multiple-bit data sub-blocks. The system also includes a bit modifier that modifies one or more bits in predetermined positions of the data sub-blocks, to ensure modulation constraints are maintained after precoding for transmission over a channel. The system modifies one or more bits of the respective data sub-blocks based on the bits of the preceding parity sub-blocks, such that the precoding does not sign invert the data sub-blocks.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
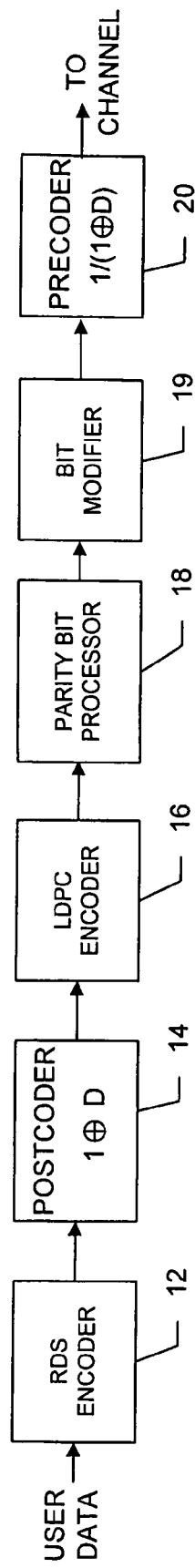
FIG. 1 is a functional block diagram of an encoding system constructed in accordance with the invention.

FIG. 1 illustrates an encoding system including encoding and processing components implemented through hardware. Referring to FIG. 1, the encoding system includes an RDS encoder 12 that encodes a block of user data in accordance with predetermined modulation constraints. The RDS encoded data are, in turn, provided to a postcoder 14, which translates the data into postcoded data by manipulating the data in a manner that is the inverse of the manipulation that occurs in a precoder 20. The postcoding of the RDS encoded data ensures that, after precoding, the RDS constraints will be maintained in the corresponding bit stream. The RDS encoder, the postcoder and the precoder are discussed in more detail below.

Figure 2A:
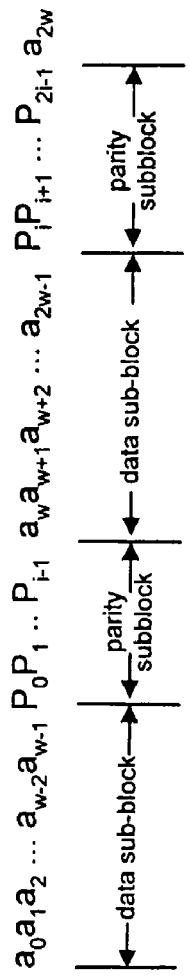
FIGS. 2A-2B illustrate a code word block before and after bits of w-bit sub-blocks are modified.

The postcoded data are provided to an error correction code (ECC) encoder 16, in the example an LDPC encoder, which is hereinafter referred to as "the LDPC encoder." The LDPC encoder 16 operates in a known manner to produce parity bits. The parity bits are supplied to a parity bit processor 18, which disperses the parity bits as i-bit parity sub-blocks across the encoded data block. The parity bit processor places a parity sub-block between respective w-bit data sub-blocks, as depicted in FIG. 2A. Alternatively, the system may insert the i-bit parity sub-blocks between selected data sub-blocks.

Figure 2B:
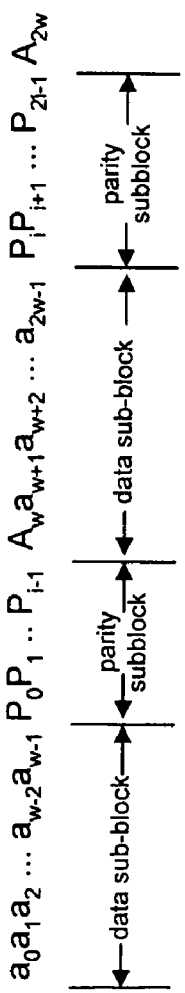

The system also manipulates the data sub-blocks, to ensure that RDS constraints are maintained through precoding. The system thus includes a bit modifier 19, which modifies one or more bits of the respective w-bit data sub-blocks, to ensure RDS constraints are maintained after precoding by the precoder 20. The operations of the bit modifier are discussed in more detail below with further reference to FIGS. 2A-B.

The data sub-blocks, manipulated as appropriate, and inserted parity sub-blocks are supplied as a data code word to the precoder 20 which, in a known manner, manipulates the code word bits to produce a precoded bit sequence. The precoder then supplies the bit sequence to a channel for transmission.

Our system thus produces a data code word that after the manipulation by the precoder results in a corresponding precoder bit stream that meets the RDS constraints. The parity bit processor 18 receives the data, which has been RDS encoded and postcoded, and the parity bits produced by the LDPC encoder 16. The parity bit processor disperses the parity bits across the encoded data block as i-bit parity sub-blocks. The processor inserts an i-bit parity sub-block between the w-bit data sub-blocks, as illustrated in FIG. 2A. Alternatively, the parity bit processor inserts the i-bit parity blocks between selected data sub-blocks.

The parity bit processor 18 further manipulates the parity sub-blocks and modifies one or more of the data bits in the respective w-bit data sub-blocks, to produce data sub-blocks that do not sign invert during precoding. As an example, we discuss a system that utilizes a $$\frac{1}{1 \oplus D}$$

precoder, where D represents a delay and ⊕ represents an XOR operation. The XOR operation produces a −1 when the input bits are the same and +1 when the input bits differ. In the example, the precoder produces a bit value, $y_k$, for an input bit $x_k$ as $$y_k = x_k \oplus y_{k-1}$$

where k is a time index.

The bit modifier 19 determines, for a given parity sub-block, what effect the sub-block will have on the succeeding data sub-block during preceding. In the example with $$\frac{1}{1 \oplus D}$$

precoding, the bit modifier determines if the parity sub-block has an even or an odd number of ones, since an odd number of ones will result in a sign inversion of the succeeding data sub-block during precoding and an even number of ones will not result in the sign inversion of the data block. If the parity bits have odd number of ones, the bit modifier changes the values of one or more of the bits of the succeeding data sub-block, such that preceding does not sign invert the data sub-block. Otherwise, the bit modifier maintains the values of the one or more data bits.

As an example, consider parity sub-blocks that contain three parity bits. The first data bit of the data sub-block following the parity bit sub-block, e.g. bit $a_w$ of FIG. 2A, is modified based on the number of ones, odd or even, in the parity block. The bit modifier thus performs the following operation:

$$P_0 \oplus P_1 \oplus P_2 \oplus a_w = A_w$$

where $A_w$ is the bit value included in the data code word (FIG. 2B) that is provided to the precoder 20.

The bit modification thus may result in a "manual" sign inversion of the first data bit of a data sub-block in the data code word, to essentially counteract the sign inversion to during preceding. The result of precoding the data code word is a bit stream that, except for the parity sub-blocks and the first data bits of respective data sub-blocks, maintains the RDS constraint over the entire block. As will be understood by those skilled in the art, the number and relative positions of the data bits that are modified depends on the precoder utilized by the system.

When the user data are to be recovered from the precoded bit stream, bit manipulation is also performed to recover the appropriate sign and reliability information for the data bits that have been modified during encoding.

Figure 3:
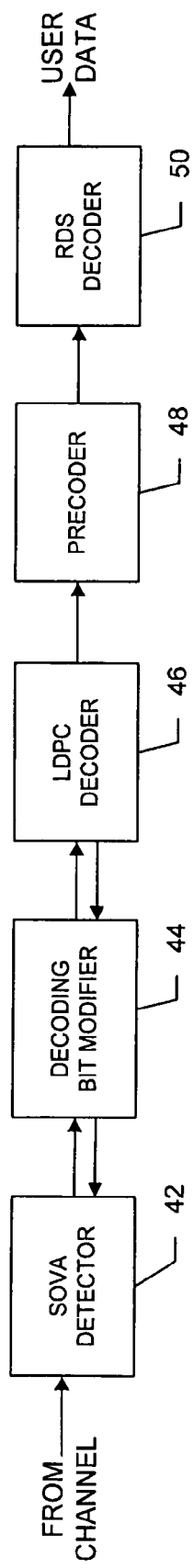
FIG. 3 is a functional block diagram of a decoding system for use with the encoding system of FIG. 1.

Referring now to FIG. 3, a detector 42, which is in the example is a soft output Viterbi algorithm ("SOVA") detector, operates in a known manner to detect bits and produce soft information that consists of bit values and corresponding reliability values. The soft information is also referred to as a log-likelihood ratio ("LLR"). The sign of the LLR indicates the bit value, or hard decision, and the magnitude of the LLR indicates the reliability or confidence level of the decision. To minimize the adverse effects that an incorrect detection of any of the parity bits will have on the decoding of the detected data bits that were modified during encoding, a decoding bit modifier 44 determines LLRs for these detected data bits based, in large part, on the LLRs of the detected parity bits.

The decoding bit modifier 44 thus uses the detected values of the bits of the respective parity sub-blocks and the corresponding modified data bits from the succeeding data sub-blocks to produce the data values for LDPC decoding by calculating:

$$P_0 \oplus P_1 \oplus P_2 \oplus A_w = a_w$$

where $a_w$ is the bit value used for LDPC decoding. The bit manipulator also determines corresponding soft information as:

$$LLR(a_w) = \text{sign}(a_w)\min\{|LLR(p_0)|, |LLR(p_1)|, |LLR(p_2)|, |LLR(A_w)|\}$$

where "sign" denotes the signum function, "min" denotes the minimum operator, and |x| denotes the absolute value of the real number x.

The decoding bit modifier 44 may instead zero out the reliability values associated with the modified data bits $a_j$. Alternatively, or in addition, the decoding bit modifier may apply the belief propagation, sum-product, or min-sum algorithm to the parity bits and corresponding modified data bits.

The bit modifier 44 passes the soft information for the entire data code word to the LDPC decoder 46. The LDPC decoder iteratively decodes the data bits and utilizes the parity bits for error detection in a known manner, after taking into account the positions of the parity bits in the code word. Before the data code word returns to the SOVA detector 42 in a global iteration, the code word passes through the decoding bit modifier 44, which reproduces the modified data bits $A_j$ and corresponding soft information based on the decoded values of the bits of the parity sub-blocks and the corresponding data bits.

The decoding bit modifier 44 reproduces the modified data bits:

$$A_w = P_0 \oplus P_1 \oplus P_2 \oplus a_w$$

where $A_w$ is the modified data bit for inclusion in the information supplied to the SOVA detector. The bit modifier also determines corresponding soft information as:

$$LLR(A_w) = \text{sign}(A_w)\min\{|LLR(p_0)|, |LLR(p_1)|, |LLR(p_2)|, |LLR(a_w)|\}$$

The soft information for all of the data and parity bits is passed to the SOVA detector 42, which operates in a known manner to produce updated soft information. Alternatively, the SOVA detector 42 and LDPC decoder 46 may be cascaded, with the first LDPC decoder passing the updated soft information for decoded data and parity bits to a next SOVA detector, and so forth.

The decoding bit modifier 44 may instead zero out the reliability values associated with the modified data bits $a_j$. Alternatively, or in addition, the decoding bit modifier may consider applying the belief propagation, sum-product, or min-sum algorithm to the parity bits and corresponding modified data bits. The foregoing description has been directed to specific embodiments. It will be apparent, however, that other variations and modifications may be made to the described embodiments, with the attainment of some or all of their advantages. For example, the ECC encoder that produces the parity bits may utilize iterative or non-iterative codes, such as, for example, block codes, convolutional codes, turbo codes instead of or in addition to the LDPC code, the processors depicted separately may be combined or a processor depicted individually may consist of several processors, the encoding system may be used with all types of recording systems, communications systems, and so forth. Similarly, the channel detector can be implemented as a SOVA detector, a BCJR detector, or a detector that utilizes other known iterative or non-iterative detection techniques. Further, the respective data sub-blocks need not all have the same numbers of bits across the data block. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method comprising steps of:
   encoding a data block in accordance with an error correction code to produce parity bits;
   producing i-bit parity sub-blocks from the parity bits, and inserting one or more parity sub-blocks between data sub-blocks;
   modifying one or more bits in predetermined positions of one or more of the data sub-blocks based on at least one preceding parity sub-block to produce a data code word including the one or more modified data sub-blocks that do not sign invert during precoding; and
   precoding the data code word to produce a precoded bit stream for transmission over a channel.

2. The method of claim 1 wherein the encoding step further includes encoding data bits of the data block in accordance with running digital sum constraints to produce the data sub-blocks.

3. The method of claim 2 further including:
   decoding the precoded bit stream to reproduce running digital sum encoded data sub-blocks and the parity sub-blocks,
   removing the parity sub-blocks, and
   decoding the running digital sum encoded data sub-blocks to reproduce the data block.

4. The method of claim 3 wherein the encoding includes postcoding before the parity bits are produced, and comprising:
   precoding the data sub-blocks after the parity bits are removed.

5. The method of claim 2 wherein the run digital sum encoded data is postcoded prior to producing the parity bits.

6. The method of claim 1 wherein the step of encoding includes encoding the data block in accordance with a low density parity check code comprising:
   decoding the encoded bit stream by reproducing the data sub-blocks and the parity sub-blocks ; and
   assigning soft information to detected bits of the parity sub-blocks and the data sub blocks, and decoding the data block in accordance with the low density parity check code.

7. The method of claim 1 further including decoding the precoded bit-stream by:
   detecting bits and assigning to the one or more bits in the predetermined positions of the one or more data sub-blocks sign and reliability values that are based on the sign and reliability values of the detected bits of the at least one preceding parity sub-block ; and
   decoding the data sub-blocks and the parity sub-blocks to reproduce the data block.

8. The method of claim 7 wherein the decoding is iterative and includes, for each iteration assigning to the one or more bits in the predetermined positions of the decoded data sub-blocks sign and reliability values that are based on the sign and reliability values of bits of the at least one parity sub-block.

9. The method of claim 1 wherein the step of encoding comprises encoding the data block in accordance with a low density parity check code.

10. A system comprising one or more hardware components, wherein the system comprises:
    an encoder that encodes a data block in accordance with an error correction code to produce parity bits;
    a parity bit processor that produces i-bit parity sub-blocks from the parity bits and inserts a parity sub-block between data sub-blocks;
    a bit modifier that modifies one or more bits in predetermined positions of one or more of the data sub-blocks based on at least one preceding parity sub-block to provide one or more modified data sub-blocks that do not sign invert during precoding; and
    a precoder that precodes the one or more modified data sub-blocks and the parity sub-block to produce a precoded bit stream for transmission over a channel.

11. The system of claim 10 wherein the system further includes:
    a postcoder that postcodes the data block before the parity bits are produced.

12. The system of claim 11 and comprising a decoder that decodes data bits of the data block and a precoder that precodes the data bits after the data bits are decoded and the parity bits are removed.

13. The system of claim 10 and comprising:
    a decoder that reproduces the data sub-blocks and the parity sub-block using soft information including bit values and corresponding reliability values.

14. The system of claim 13 wherein the encoder includes a low density parity check encoder and comprising a low density parity check decoder.

15. The system of claim 10 wherein the encoder includes a running digital sum encoder that encodes the data block to meet running digital sum constraints.

16. The system of claim 10 and comprising:
    a detector that detects bits and assigns to the one or more bits in the predetermined positions of the one or more data sub-blocks sign and reliability values that are based on the sign and reliability values of bits of the at least one preceding parity sub-block; and
    an iterative decoder that decodes the data sub-blocks and the parity sub-block to reproduce the data block using the sign and reliability values.

17. The system of claim 16 wherein, for each iteration back to the detector, the iterative decoder assigns, to the one or more bits in the predetermined positions of the one or more data sub-blocks, modified sign and reliability values that are based on the sign and reliability values of the preceding parity bits of the at least one preceding parity sub-block.

18. The system of claim 10 wherein the encoder that encodes the data block to produce the parity bits is a low density parity check encoder.

19. The system of claim 10 including a run digital sum encoder to provide run digital sum constraints.

20. The system of claim 19 and comprising a postcoder configured to postcode the run digital sum encoded data.

* * * * *